United States Patent
Khlat

(10) Patent No.: US 12,323,103 B2
(45) Date of Patent: Jun. 3, 2025

(54) WIDE BANDWIDTH ENVELOPE TRACKING INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

(*) Notice: Subject to any disclaimer, the term of this patent is extended or adjusted under 35 U.S.C. 154(b) by 741 days.

(21) Appl. No.: 17/523,999

(22) Filed: Nov. 11, 2021

(65) Prior Publication Data

US 2022/0360227 A1  Nov. 10, 2022

Related U.S. Application Data

(60) Provisional application No. 63/185,923, filed on May 7, 2021.

(51) Int. Cl.
*H03F 1/02* (2006.01)
*H03F 3/19* (2006.01)

(52) U.S. Cl.
CPC ............. *H03F 1/0216* (2013.01); *H03F 3/19* (2013.01); *H03F 2200/105* (2013.01); *H03F 2200/375* (2013.01); *H03F 2200/451* (2013.01)

(58) Field of Classification Search
CPC .... H03F 1/0216; H03F 3/19; H03F 2200/105; H03F 2200/375; H03F 2200/451; H03F 2200/102; H03F 1/0227; Y02D 30/70
USPC ........................................................ 330/297
See application file for complete search history.

(56) References Cited

U.S. PATENT DOCUMENTS

| | | | |
|---|---|---|---|
| 8,154,341 | B2 | 4/2012 | Ishikawa et al. |
| 11,349,436 | B2 | 5/2022 | Khlat |
| 11,658,614 | B2 | 5/2023 | Khlat |
| 11,973,469 | B2 | 4/2024 | Retz et al. |
| 2012/0163632 | A1 | 6/2012 | Lesso et al. |
| 2012/0170770 | A1 | 7/2012 | Lesso et al. |
| 2016/0164551 | A1 | 6/2016 | Khlat et al. |
| 2018/0241347 | A1 | 8/2018 | Petrovic et al. |
| 2018/0331659 | A1 | 11/2018 | Khesbak et al. |
| 2020/0304082 | A1 | 9/2020 | Henzler et al. |

(Continued)

OTHER PUBLICATIONS

U.S. Appl. No. 17/523,985, filed Nov. 11, 2021.

(Continued)

*Primary Examiner* — Andrea Lindgren Baltzell
*Assistant Examiner* — Jose E Pinero
(74) *Attorney, Agent, or Firm* — Withrow & Terranova, P.L.L.C.

(57) ABSTRACT

An envelope tracking (ET) integrated circuit (ETIC) is provided. The ETIC is configured to generate an ET voltage for amplifying a radio frequency (RF) signal modulated for communication in multiple time intervals. In embodiments disclosed herein, the ETIC is self-contained to generate an ET target voltage based on a power envelope of the RF signal and to generate the ET voltage based on the ET target voltage. Given that the RF signal may be modulated at a very high modulation bandwidth, the ETIC can be configured to modify the ET target voltage in each of the time intervals to thereby cause the ET voltage to be adapted on a per time interval basis. As a result, the ET voltage can better track the power envelope of the RF signal in each of the time intervals to help improve operating efficiency of a power amplifier apparatus that employs the ETIC.

21 Claims, 4 Drawing Sheets

(56) References Cited

U.S. PATENT DOCUMENTS

2021/0194517 A1    6/2021    Mirea et al.
2022/0286094 A1*  9/2022    Granger-Jones ...... H03F 1/0222

OTHER PUBLICATIONS

U.S. Appl. No. 17/523,966, filed Nov. 11, 2021.
U.S. Appl. No. 17/523,957, filed Nov. 11, 2021.
U.S. Appl. No. 17/507,173, filed Oct. 21, 2021.
Non-Final Office Action for U.S. Appl. No. 17/523,985, mailed Apr. 25, 2024, 8 pages.
Non-Final Office Action for U.S. Appl. No. 17/523,966, mailed Jun. 11, 2024, 6 pages.
Notice of Allowance for U.S. Appl. No. 17/507,173, mailed Apr. 10, 2024, 9 pages.
Notice of Allowance for U.S. Appl. No. 17/523,957, mailed Jan. 13, 2023, 9 pages.
Notice of Allowance for U.S. Appl. No. 17/523,985, mailed Sep. 3, 2024, 8 pages.
Notice of Allowance for U.S. Appl. No. 17/523,966, mailed Oct. 11, 2024, 7 pages.

* cited by examiner

WIDE BANDWIDTH ENVELOPE TRACKING INTEGRATED CIRCUIT

RELATED APPLICATIONS

This application claims the benefit of U.S. provisional patent application Ser. No. 63/185,923 filed on May 7, 2021, the disclosure of which is hereby incorporated herein by reference in its entirety.

FIELD OF THE DISCLOSURE

The technology of the disclosure relates generally to an envelope tracking (ET) power management circuit.

BACKGROUND

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency.

Downlink and uplink transmissions in a 5G-NR system are widely based on orthogonal frequency division multiplexing (OFDM) technology. In an OFDM based system, physical radio resources are divided into a number of subcarriers in a frequency domain and a number of OFDM symbols in a time domain. The subcarriers are orthogonally separated from each other by a subcarrier spacing (SCS). The OFDM symbols are separated from each other by a cyclic prefix (CP), which acts as a guard band to help overcome inter-symbol interference (ISI) between the OFDM symbols.

A radio frequency (RF) signal communicated in the OFDM based system is often modulated into multiple subcarriers in the frequency domain and multiple OFDM symbols in the time domain. The multiple subcarriers occupied by the RF signal collectively define a modulation bandwidth of the RF signal. The multiple OFDM symbols, on the other hand, define multiple time intervals during which the RF signal is communicated. In the 5G-NR system, the RF signal is typically modulated with a high modulation bandwidth in excess of 200 MHz (e.g., 1 GHz).

The duration of an OFDM symbol depends on the SCS and the modulation bandwidth. The table below (Table 1) provides some OFDM symbol durations, as defined by 3G partnership project (3GPP) standard for various SCSs and modulation bandwidths. Notably, the higher the modulation bandwidth is, the shorter the OFDM symbol duration will be. For example, when the SCS is 120 KHz and the modulation bandwidth is 400 MHz, the OFDM symbol duration is 8.93 μs. Accordingly, a transition settling time between two consecutive OFDM symbols will be less than or equal to the CP duration of 0.59 μs.

TABLE 1

| SCS (KHz) | CP (μs) | OFDM Symbol Duration (μs) | Modulation Bandwidth (MHz) |
|---|---|---|---|
| 15 | 4.69 | 71.43 | 50 |
| 30 | 2.34 | 35.71 | 100 |
| 60 | 1.17 | 17.86 | 200 |
| 120 | 0.59 | 8.93 | 400 |

In the 5G-NR system, the RF signal is communicated in a millimeter wave (mmWave) spectrum that is typically above 6 GHz. Notably, the RF signal transmitted in the mmWave spectrum may be more susceptible to propagation attenuation and interference that can result in substantial reduction in data throughput. To help mitigate propagation attenuation and maintain desirable data throughput, power amplifiers are typically employed in a wireless communication device (e.g., smartphone) to amplify the RF signal before transmitting in the mmWave spectrum.

Envelope tracking (ET) is a power management technique designed to improve operating efficiency of the power amplifiers. To support ET in the wireless communication device, an ET integrated circuit (ETIC) is typically employed to generate a time-variant ET voltage that closely tracks a time-variant power envelope of the RF signal. The power amplifiers, in turn, are configured to amplify the RF signal based on the time-variant ET voltage. Understandably, the closer the time-variant ET voltage tracks the time-variant power envelope, the higher efficiency can be achieved at the power amplifiers.

SUMMARY

Embodiments of the disclosure relate to an envelope tracking (ET) integrated circuit (ETIC). The ETIC is configured to generate an ET voltage for amplifying a radio frequency (RF) signal modulated for communication in multiple time intervals. In embodiments disclosed herein, the ETIC is self-contained to generate an ET target voltage based on a power envelope of the RF signal and to generate the ET voltage based on the ET target voltage. Given that the RF signal may be modulated at a very high modulation bandwidth (e.g., 200 MHz), the ETIC can be configured to modify the ET target voltage in each of the time intervals to thereby cause the ET voltage to be adapted on a per time interval basis. As a result, the ET voltage can better track the power envelope of the RF signal in each of the time intervals to help improve operating efficiency of a power amplifier apparatus that employs the ETIC.

In one aspect, an ETIC is provided. The ETIC includes an ET voltage circuit. The ET voltage circuit is configured to generate an ET voltage based on an ET target voltage for amplifying an RF signal modulated for transmission in multiple time intervals. The ETIC also includes a target voltage generation circuit. The target voltage generation circuit is configured to generate the ET target voltage based on a power envelope of the RF signal. The ETIC also includes a target voltage processing circuit. The target voltage processing circuit is configured to receive the ET voltage from the target voltage generation circuit. The target voltage processing circuit is also configured to modify the ET target voltage in each of the multiple time intervals to generate a modified ET target voltage in response to the RF signal being modulated in a modulation bandwidth higher than or equal to a bandwidth threshold. The target voltage processing circuit is also configured to provide the modified ET target voltage to the ET voltage circuit as the ET target voltage to thereby cause the ET voltage circuit to generate the ET voltage based on the modified ET target voltage.

In another aspect, a power amplifier apparatus is provided. The power amplifier apparatus includes an ETIC. The ETIC includes an ET voltage circuit. The ET voltage circuit is configured to generate an ET voltage based on an ET target voltage for amplifying an RF signal modulated for transmission in multiple time intervals. The ETIC also includes a target voltage generation circuit. The target voltage generation circuit is configured to generate the ET target voltage based on a power envelope of the RF signal. The ETIC also includes a target voltage processing circuit. The target voltage processing circuit is configured to receive the ET voltage from the target voltage generation circuit. The target voltage processing circuit is also configured to modify the ET target voltage in each of the multiple time intervals to generate a modified ET target voltage in response to the RF signal being modulated in a modulation bandwidth higher than or equal to a bandwidth threshold. The target voltage processing circuit is also configured to provide the modified ET target voltage to the ET voltage circuit as the ET target voltage to thereby cause the ET voltage circuit to generate the ET voltage based on the modified ET target voltage. The power amplifier apparatus also includes at least one high-bandwidth power amplifier circuit. The at least one high-bandwidth power amplifier circuit is configured to amplify the RF signal modulated in the modulation bandwidth higher than or equal to the bandwidth threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
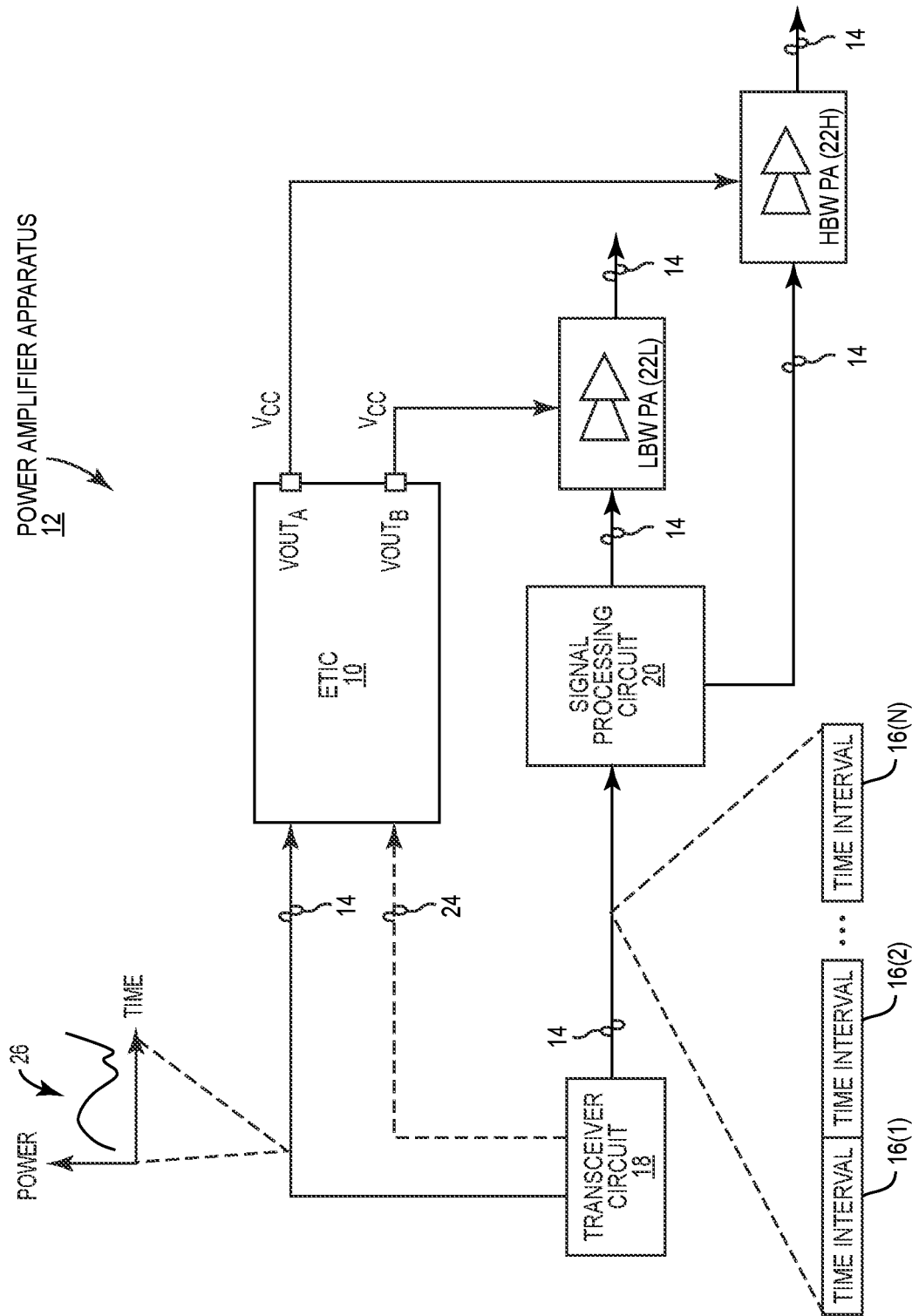
FIG. 1 is a schematic diagram of an exemplary envelope tracking (ET) integrated circuit (ETIC) provided in a power amplifier apparatus and configured according to embodiments of the present disclosure to generate an ET voltage for amplifying a radio frequency (RF) signal modulated for transmission in a multiple time intervals.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (ETIC). The ETIC is configured to generate an ET voltage for amplifying a radio frequency (RF) signal modulated for communication in multiple time intervals. In embodiments disclosed herein, the ETIC is self-contained to generate an ET target voltage based on a power envelope of the RF signal and to generate the ET voltage based on the ET target voltage. Given that the RF signal may be modulated at a very high modulation bandwidth (e.g., 200 MHz), the ETIC can be configured to modify the ET target voltage in each of the time intervals to thereby cause the ET voltage to be adapted on a per time interval basis. As a result, the ET voltage can better track the power envelope of the RF signal in each of the time intervals to help improve operating efficiency of a power amplifier apparatus that employs the ETIC.

In this regard, FIG. 1 is a schematic diagram of an exemplary ETIC 10 provided in a power amplifier apparatus 12 and configured according to embodiments of the present disclosure to generate an ET voltage $V_{CC}$ for amplifying an RF signal 14 modulated for transmission in multiple time intervals 16(1)-16(N). Herein, a modulation bandwidth is referred to as a higher (or wide) modulation bandwidth when the modulation bandwidth is higher than or equal to a bandwidth threshold (e.g., 200 MHz), or a lower (or narrow) modulation bandwidth when the modulation bandwidth is lower than the bandwidth threshold. In a non-limiting example, each of the time intervals 16(1)-16(N) has a duration of an orthogonal frequency division multiplexing (OFDM) symbol, which is inversely related to the modulation bandwidth of the RF signal 14.

In an embodiment, the power amplifier apparatus 12 includes a transceiver circuit 18 that is configured to generate and modulate the RF signal 14 in the time intervals 16(1)-16(N) based on any subcarrier spacing (SCS) configuration as listed in Table 1 above. In this regard, the RF signal 14 can be so generated to have the higher modulation bandwidth or the lower modulation bandwidth.

The transceiver circuit 18 is configured to provide the RF signal 14 to the ETIC and a signal processing circuit 20. In a non-limiting example, the transceiver circuit 18 can provide the RF signal 14 to the ETIC 10 and the signal processing circuit 20 in an intermediate frequency (IF).

The signal processing circuit 20 may be configured to upconvert the RF signal 14 from the IF to an appropriate carrier frequency. In an embodiment, the signal processing circuit 20 provides the RF signal 14 to at least one high-bandwidth power amplifier circuit 22H (denoted as "HBW PA") when the RF signal 14 is modulated in the higher modulation bandwidth, and to at least one low-bandwidth power amplifier circuit 22L (denoted as "LBW PA") when the RF signal 14 is modulated in the lower modulation bandwidth. In this regard, in a non-limiting example, only one of the high-bandwidth power amplifier circuit 22H and the low-bandwidth power amplifier circuit 22L can be active at a given time, depending on the modulation bandwidth of the RF signal 14.

The ETIC 10 includes a pair of voltage outputs $VOUT_A$ and $VOUT_B$ that are coupled to the high-bandwidth power amplifier circuit 22H and the low-bandwidth power amplifier circuit 22L, respectively. In embodiments disclosed herein, the ETIC 10 is configured to provide the ET voltage $V_{CC}$ to the voltage output $VOUT_A$ when the RF signal 14 is modulated in the higher modulation bandwidth, and to the voltage output $VOUT_B$ when the RF signal 14 is modulated in the lower modulation bandwidth. In a non-limiting example, the transceiver circuit 18 can provide a bandwidth indication signal 24 to thereby indicate to the ETIC 10 the modulation bandwidth of the RF signal 14.

The ETIC 10 is configured to generate the ET voltage $V_{CC}$ based on a power envelope 26 associated with the RF signal 14. Notably, the power envelope 26 can vary (rise or fall) rapidly during each of the time intervals 16(1)-16(N). On the other hand, the high-bandwidth power amplifier circuit 22H and the low-bandwidth power amplifier circuit 22L are each operating as a current source to the ETIC 10. As a result, any misalignment between the ET voltage $V_{CC}$ and the power envelope 26 will not only reduce operation efficiency and/or linearity of the high-bandwidth power amplifier circuit 22H and the low-bandwidth power amplifier circuit 22L, but also cause some degree of distortion (e.g., amplitude clipping) to the RF signal 14. Moreover, the degree of distortion caused by the high-bandwidth power amplifier circuit 22H can be far more severe due to the higher modulation bandwidth of the RF signal 14.

As such, it is desirable to make sure the ETIC 10 can adapt the ET voltage $V_{CC}$ during each of the time intervals 16(1)-16(N) when the RF signal 14 is modulated in the higher modulation bandwidth. In contrast, since the distortion may be less severe when the RF signal 14 is modulated in the lower modulation bandwidth, it is also desirable that the ETIC 10 does not adapt the ET voltage $V_{CC}$ during each of the time intervals 16(1)-16(N) to help reduce computational complexity of the ETIC 10. Moreover, it is desirable for the ETIC 10 to generate the ET voltage $V_{CC}$ for the lower modulation bandwidth and the higher modulation bandwidth based on a same hardware architecture.

Figure 2:
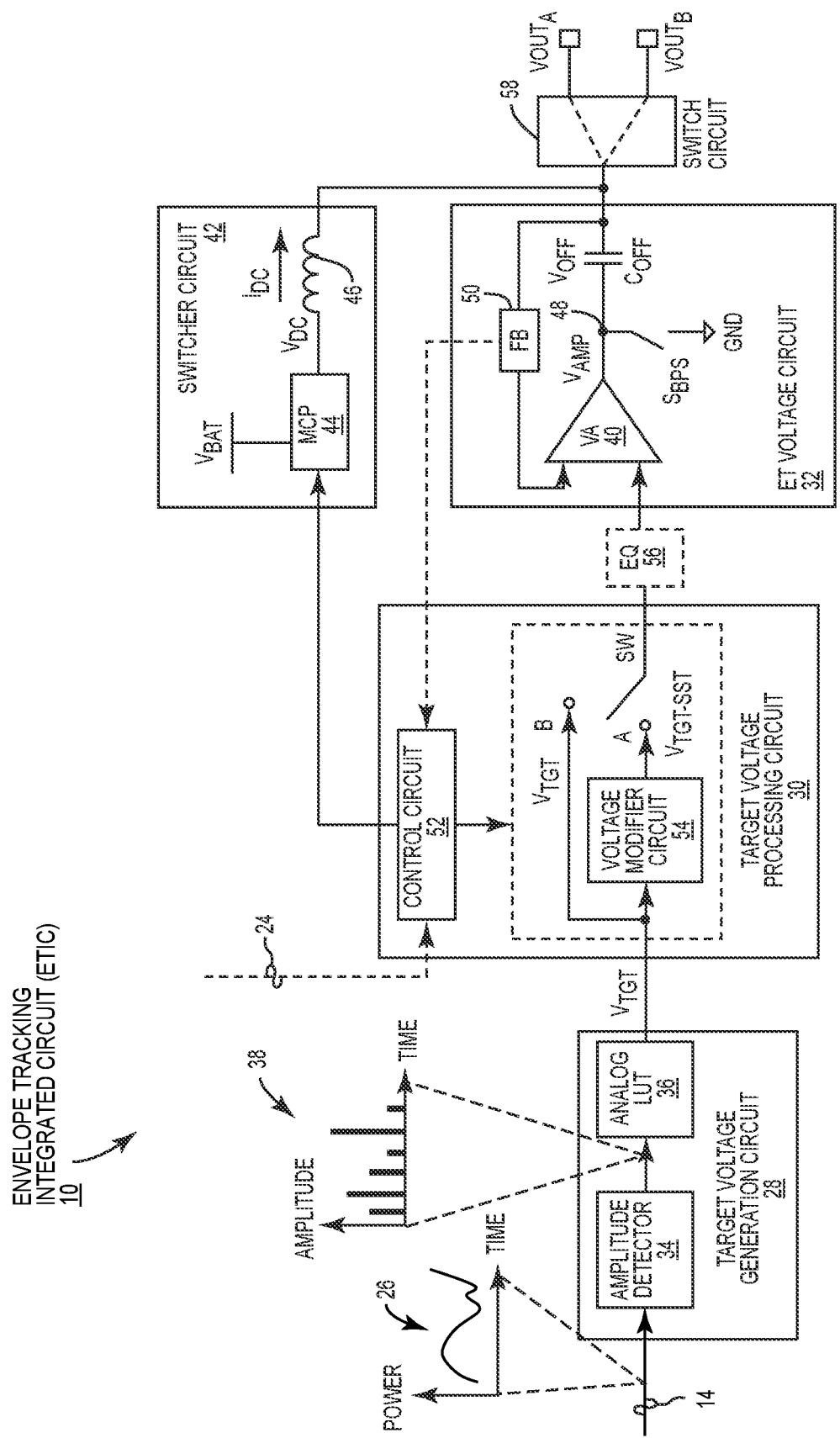
FIG. 2 is a schematic diagram of the ETIC in FIG. 1 configured according to an embodiment of the present disclosure to generate the ET voltage across a wide modulation bandwidth.

In this regard, FIG. 2 is a schematic diagram of the ETIC 10 in FIG. 1 configured according to an embodiment of the present disclosure to generate the ET voltage $V_{CC}$ across a wide modulation bandwidth. Common elements between FIGS. 1 and 2 are shown therein with common element numbers and will not be re-described herein.

In an embodiment, the ETIC 10 is self-contained to include a target voltage generation circuit 28, a target voltage processing circuit 30, and an ET voltage circuit 32. The target voltage generation circuit 28 is configured to generate an ET target voltage $V_{TGT}$ based on the power envelope 26 associated with the RF signal 14. The target voltage processing circuit 30 is configured to modify the ET target voltage $V_{TGT}$ in each of the time intervals 16(1)-16(N) to generate a modified ET target voltage $V_{TGT\text{-}SST}$. More specifically, the target voltage processing circuit 30 is configured to modify the ET target voltage $V_{TGT}$ and provide the modified ET target voltage $V_{TGT\text{-}SST}$ to the ET voltage circuit 32 only when the RF signal 14 is modulated in the higher modulation bandwidth. In case the RF signal 14 is modulated in the lower modulation bandwidth, the target voltage processing circuit 30 will simply output the ET target voltage $V_{TGT}$ to the ET voltage circuit 32. As a result, the ET voltage circuit 32 can generate the ET voltage $V_{CC}$ based on the modified ET target voltage $V_{TGT\text{-}SST}$ when the RF signal 14 is modulated in the higher modulation bandwidth or based on the ET target voltage $V_{TGT}$ when the RF signal 14 is modulated in the lower modulation bandwidth. As a result, the ET voltage $V_{CC}$ can better track the power envelope 26 of the RF signal 14 across the wide modulation bandwidth to help improve operating efficiency and linearity of the high-bandwidth power amplifier circuit 22H and the low-bandwidth power amplifier circuit 22L, and to reduce distortion to the RF signal 14.

In an embodiment, the target voltage generation circuit 28 includes an amplitude detector circuit 34 and an analog lookup table (LUT) circuit 36. The amplitude detector circuit 34 is configured to determine a time-variant amplitude 38 based on the power envelope 26 of the RF signal 14. The analog LUT circuit 36 is configured to generate the ET target voltage $V_{TGT}$ based on the time-variant amplitude 38. In a non-limiting example, the analog LUT circuit 36 can include an analog LUT (not shown) that correlates the time-variant amplitude 38 with the ET target voltage $V_{TGT}$. Accordingly, the analog LUT circuit 36 is configured to generate the ET target voltage $V_{TGT}$ based on the correlation established in the analog LUT.

In an embodiment, the ET voltage circuit 32 includes a voltage amplifier 40 and an offset capacitor $C_{OFF}$. The voltage amplifier 40 is configured to generate an initial ET voltage $V_{AMP}$ based on the modified ET voltage $V_{TGT\text{-}SST}$ when the RF signal 14 is modulated in the higher modulation bandwidth. In contrast, when the RF signal 14 is modulated in the lower modulation bandwidth, the voltage amplifier 40 is configured to generate the initial ET voltage $V_{AMP}$ based on the modified ET voltage $V_{TGT}$. The offset capacitor $C_{OFF}$ is configured to raise the initial ET voltage $V_{AMP}$ by an offset voltage $V_{OFF}$ to thereby generate the ET voltage $V_{CC}$ ($V_{CC}=V_{AMP}+V_{OFF}$). Notably, by providing the offset capacitor $C_{OFF}$ to raise the initial ET voltage $V_{AMP}$, the voltage amplifier 40 can generate the initial ET voltage $V_{AMP}$ at a lower level than the ET voltage $V_{CC}$, thus helping to improve headroom and efficiency of the voltage amplifier 40.

In an embodiment, the ETIC 10 includes a switcher circuit 42 configured to modulate the offset voltage $V_{OFF}$ based on a battery voltage $V_{BAT}$ and the ET target voltage $V_{TGT}$. In a non-limiting example, the switcher circuit 42 can include a multi-level charge pump (MCP) 44 and a power inductor 46. The MCP 44 is configured to generate a low-frequency voltage VDC as a function of the battery voltage $V_{BAT}$ and in accordance with a duty cycle. In a non-limiting example, the MCP 44 can generate the low-frequency voltage VDC at $0 \times V_{BAT}$ (0 V), $1 \times V_{BAT}$, or $2 \times V_{BAT}$ based on the duty cycle. For example, if the battery voltage $V_{BAT}$ is 5 V and the duty cycle is 30% at $0 \times V_{BAT}$ (0 V), 30% at $1 \times V_{BAT}$, and 40% at $2 \times V_{BAT}$, the MCP 44 will then generate the low-frequency voltage VDC at 5.5 V (0×30%+5×30%+10×40%). The power inductor 46 is configured to induce a low-frequency current IDC to charge the offset capacitor $C_{OFF}$ to the offset voltage $V_{OFF}$. In the embodiment disclosed herein, the duty cycle can be determined based on the ET target voltage $V_{TGT}$. Accordingly, the offset voltage $V_{OFF}$ can be modulated based on the ET target voltage $V_{TGT}$ and therefore the ET voltage $V_{CC}$.

In an embodiment, the ET voltage circuit 32 includes a bypass switch $S_{BPS}$ coupled to an output node 48 of the voltage amplifier 40 and a ground (GND). The bypass switch $S_{BPS}$ is closed to thereby allow the low-frequency current IDC to charge the offset capacitor $C_{OFF}$ toward the offset voltage $V_{OFF}$ and opened when the offset voltage $V_{OFF}$ is reached.

The ET voltage circuit 32 can also include a feedback circuit 50 (denoted as "FB"). The feedback circuit 50 can be configured to provide a feedback of the ET voltage $V_{CC}$ to the voltage amplifier 40 to thereby make the ET voltage circuit 32 a closed-loop ET voltage circuit.

In an embodiment, the target voltage processing circuit 30 includes a control circuit 52 and a voltage modifier circuit 54. The control circuit 52 may be configured to determine the modulation bandwidth of the RF signal 14 based on, for example, the bandwidth indication signal 24. Accordingly, the control circuit 52 may determine the duty cycle for the MCP 44 based on the determined modulation bandwidth and/or the feedback of the ET voltage $V_{CC}$.

The control circuit 52 can be further configured to cause the target voltage processing circuit 30 to modify the ET target voltage $V_{TGT}$ in each of the time intervals 16(1)-16(N) to generate the modified ET target voltage $V_{TGT-SST}$ in response to the modulation bandwidth being higher than or equal to the bandwidth threshold. The control circuit 52 can also be configured to cause the target voltage processing circuit 30 not to modify the ET target voltage $V_{TGT}$ in response to the modulation bandwidth being lower than the bandwidth threshold.

In a non-limiting example, the target voltage processing circuit 30 can include a target voltage output switch SW (e.g., a single-pole double-throw switch). In response to determining whether the modulation bandwidth is higher than or equal to the bandwidth threshold, the control circuit 52 can activate the voltage modifier circuit 54 to generate the modified ET target voltage $V_{TGT-SST}$ and couple the target voltage output switch SW to node A to thereby provide the modified ET target voltage $V_{TGT-SST}$ to the ET voltage circuit 32. In contrast, in response to determining that the modulation bandwidth is lower than the bandwidth threshold, the control circuit 52 can deactivate the voltage modifier circuit 54 and couple the target voltage output switch SW to node B to thereby provide the ET target voltage $V_{TGT}$ to the ET voltage circuit 32.

In an embodiment, the ETIC 10 may also include an equalizer circuit 56 (denoted as "EQ"). The equalizer circuit 56 can be configured to equalize the modified ET target voltage $V_{TGT-SST}$ or the ET target voltage $V_{TGT}$ based on a transfer function (e.g., a second-order complex-zero transfer function) to help offset a trace inductance that can exist between the voltage output $VOUT_A$ and the high-bandwidth power amplifier circuit 22H and the voltage output $VOUT_B$ and the low-bandwidth power amplifier circuit 22L.

The ETIC 10 may also include a switch circuit 58. The switch circuit 58 can be controlled, for example by the control circuit 52, to couple the ET voltage $V_{CC}$ to the voltage output $VOUT_A$ when the RF signal 14 is modulated in the higher modulation bandwidth or to the voltage output $VOUT_B$ when the RF signal 14 is modulated in the lower modulation bandwidth.

The voltage modifier circuit 54 can be configured to modify the ET target voltage $V_{TGT}$ in each of the time intervals 16(1)-16(N) in accordance with any embodiments as discussed next in FIGS. 3 and 4. In examples discussed herein, the time intervals 16(1)-16(N) are assumed to correspond to an OFDM symbol. Specifically, FIGS. 3 and 4 each illustrate three consecutive OFDM symbols $S_{N-1}$, $S_N$, and $S_{N+1}$, which can correspond to any three consecutive ones of the time intervals 16(1)-16(N).

Figure 3:
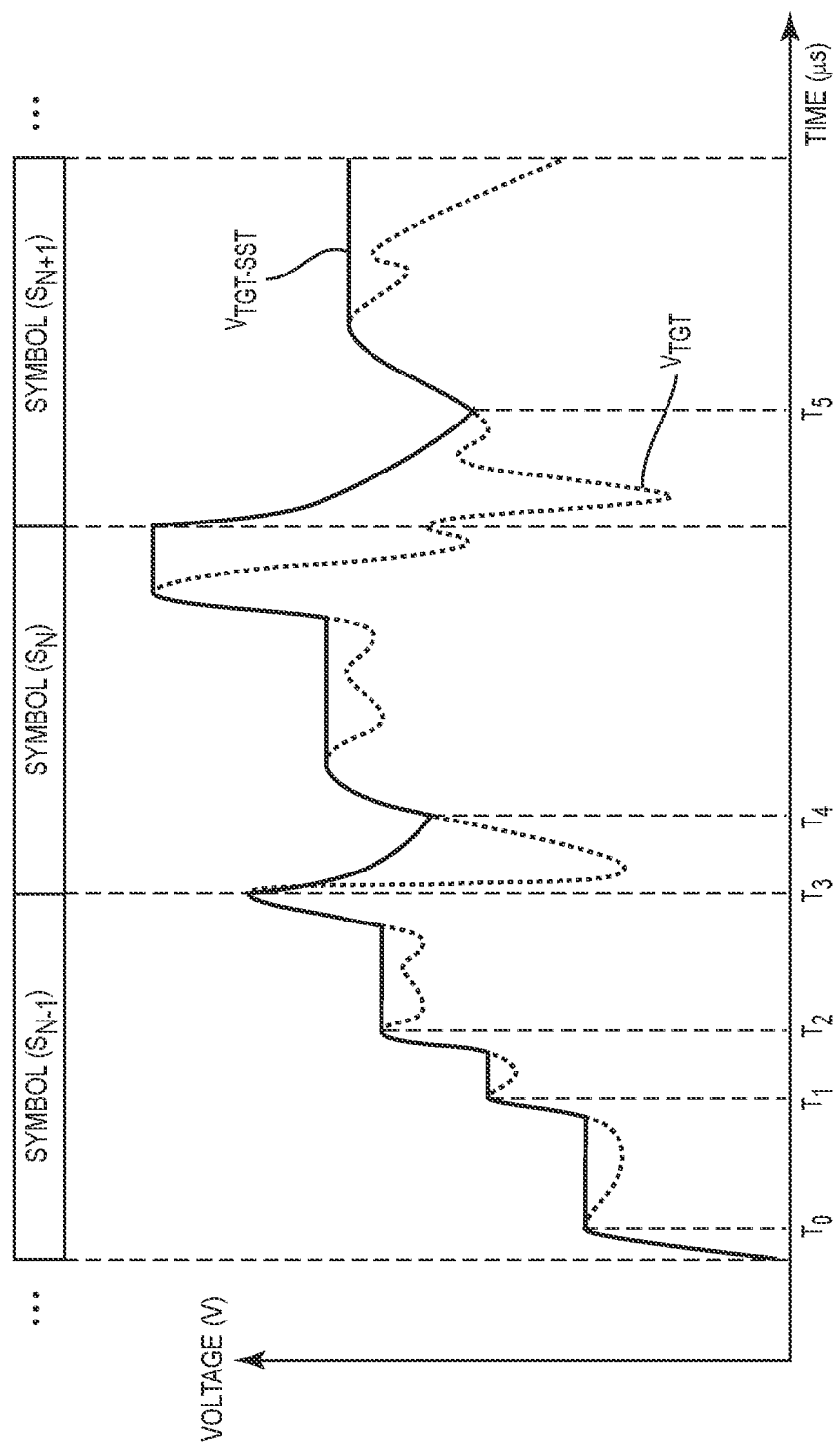
FIGS. 3 and 4 are diagrams providing exemplary illustrations of embodiments that may be implemented by the ETIC 10 in FIGS. 1 and 2 to modify the ET target voltage in each of the multiple time intervals.
Figure 4:
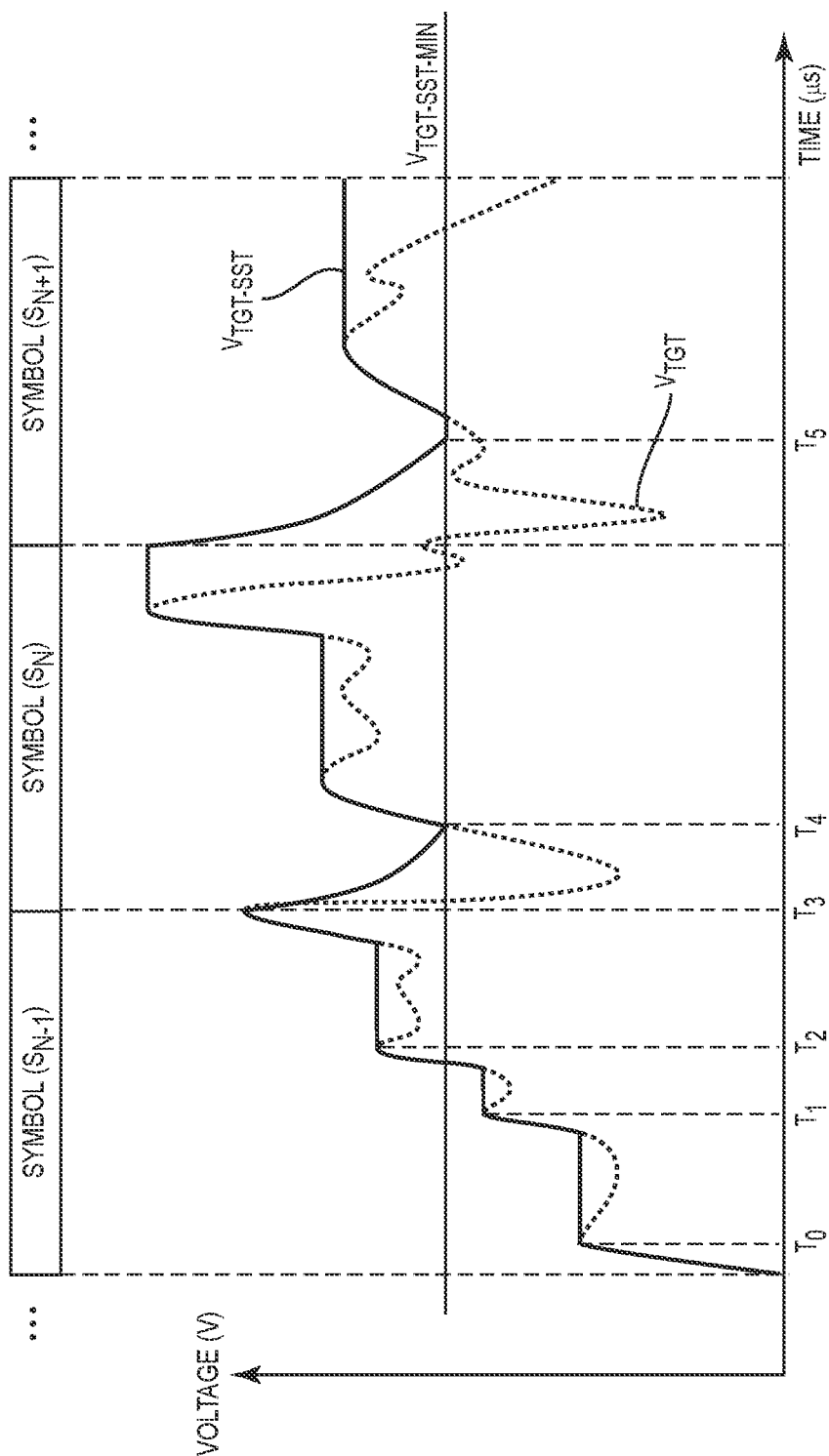

FIGS. 3 and 4 are diagrams providing exemplary illustrations of embodiments that may be implemented by the voltage modifier circuit 54 in the ETIC 10 in FIGS. 1 and 2 to modify the ET target voltage in each of the time intervals 16(1)-16(N). In the embodiment, in each of the OFDM symbols $S_{N-1}$, $S_N$, and $S_{N+1}$, the voltage modifier circuit 54 is configured to increase the modified ET target voltage $V_{TGT-SST}$ at each peak of the ET target voltage $V_{TGT}$. For example, in the OFDM symbol $S_{N-1}$, the ET target voltage $V_{TGT}$ reaches multiple peaks at times $T_0$, $T_1$, $T_2$, and $T_3$, respectively. Accordingly, the voltage modifier circuit 54 increases the modified ET target voltage $V_{TGT-SST}$ at times $T_0$, $T_1$, $T_2$, and $T_3$, respectively. In a non-limiting example, the voltage modifier circuit 54 can be configured to increase the modified ET target voltage $V_{TGT-SST}$ along a rising edge of the ET target voltage $V_{TGT}$ at times $T_0$, $T_1$, $T_2$, and $T_3$. In contrast, when the ET target voltage $V_{TGT}$ is off the peaks (e.g., decreases) between times $T_0$-$T_1$, $T_1$-$T_2$, and $T_2$-$T_3$, the voltage modifier circuit 54 will maintain the modified ET target voltage $V_{TGT-SST}$, as opposed to decreasing the modified ET target voltage $V_{TGT-SST}$ along with the decrease of the ET target voltage $V_{TGT}$.

To prevent the modified ET target voltage $V_{TGT-SST}$ from continuing to going up, the voltage modifier circuit 54 can be configured to decay the modified ET target voltage $V_{TGT-SST}$ from a peak level of the modified ET target voltage $V_{TGT-SST}$ set in an immediately preceding one of the OFDM symbols $S_{N-1}$, $S_N$, and $S_{N+1}$. For example, the voltage modifier circuit 54 can be configured to decay the modified ET target voltage $V_{TGT-SST}$ in the OFDM symbol $S_N$ from the peak level set during the OFDM symbol $S_{N-1}$, to decay the modified ET target voltage $V_{TGT}$-SST in the OFDM symbol $S_{N+1}$ from the peak level set during the OFDM symbol $S_N$, and so on. In an embodiment, the voltage modifier circuit 54 can decay the modified ET target voltage $V_{TGT-SST}$ at a start of each of the OFDM symbols $S_{N-1}$, $S_N$, and $S_{N+1}$.

In an embodiment, as shown in FIG. 3, the voltage modifier circuit 54 can decay the modified ET target voltage $V_{TGT-SST}$ until the modified ET target voltage $V_{TGT-SST}$ intersects the ET target voltage $V_{TGT}$. More specifically, the modified ET target voltage $V_{TGT-SST}$ should intersect the ET target voltage $V_{TGT}$ at a level (e.g., at times $T_4$ and $T_5$) that is lower than the peak level of the modified ET target voltage $V_{TGT-SST}$ in the immediately preceding one of the OFDM symbols $S_{N-1}$, $S_N$, and $S_{N+1}$.

In another embodiment, as shown in FIG. 4, the voltage modifier circuit 54 can decay the modified ET target voltage $V_{TGT-SST}$ to a predefined minimum level $V_{TGT-SST-MIN}$ in each of the OFDM symbols $S_{N-1}$, $S_N$, and $S_{N+1}$ independent of the ET target voltage $V_{TGT}$. For example, the modified ET target voltage $V_{TGT-SST}$ is decayed until intersecting with the predefined minimum level $V_{TGT-SST-MIN}$ at times $T_4$ and $T_5$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (ETIC) comprising:
    an ET voltage circuit configured to generate an ET voltage based on an ET target voltage for amplifying a radio frequency (RF) signal modulated for transmission in a plurality of time intervals;
    a target voltage generation circuit configured to generate the ET target voltage based on a power envelope of the RF signal; and
    a target voltage processing circuit configured to:
        receive the ET voltage from the target voltage generation circuit;
        modify the ET target voltage in each of the plurality of time intervals to generate a modified ET target voltage in response to the RF signal being modulated in a modulation bandwidth higher than or equal to a bandwidth threshold; and
        provide the modified ET target voltage to the ET voltage circuit as the ET target voltage to thereby cause the ET voltage circuit to generate the ET voltage based on the modified ET target voltage.

2. The ETIC of claim 1, wherein the target voltage processing circuit is further configured to pass the ET voltage directly to the ET voltage circuit in response to the modulation bandwidth being lower than the bandwidth threshold.

3. The ETIC of claim 1, wherein each of the plurality of time intervals has a duration of an orthogonal frequency division multiplexing (OFDM) symbol.

4. The ETIC of claim 1, wherein the target voltage processing circuit is further configured to determine the modulation bandwidth based on a bandwidth indication signal.

5. The ETIC of claim 1, wherein the target voltage generation circuit comprises:
    an amplitude detector circuit configured to determine a time-variant amplitude of the RF signal; and
    an analog lookup table (LUT) circuit configured to generate the ET target voltage based on the detected time-variant amplitude.

6. The ETIC of claim 1, wherein the ET voltage circuit comprises:
    a voltage amplifier configured to:
        generate an initial ET voltage based on the modified ET target voltage when the modulation bandwidth is higher than or equal to the bandwidth threshold; and
        generate the initial ET voltage based on the ET target voltage when the modulation bandwidth is lower than the bandwidth threshold; and
    an offset capacitor configured to raise the initial ET voltage by an offset voltage to thereby generate the ET voltage.

7. The ETIC of claim 6, further comprising a switcher circuit configured to modulate the offset voltage based on a battery voltage and the ET target voltage.

8. The ETIC of claim 7, wherein the switcher circuit comprises:
    a multi-level charge pump (MCP) configured to generate a low-frequency voltage as a function of the battery voltage in accordance with a duty cycle determined based on the ET target voltage; and
    a power inductor configured to induce a low-frequency current to charge the offset capacitor to the offset voltage.

9. The ETIC of claim 1, wherein the target voltage processing circuit comprises a control circuit configured to:
    determine the modulation bandwidth;
    cause the target voltage processing circuit to modify the ET target voltage in each of the plurality of time intervals to generate the modified ET target voltage in response to the modulation bandwidth being higher than or equal to the bandwidth threshold; and
    cause the target voltage processing circuit not to modify the ET target voltage in response to the modulation bandwidth being lower than the bandwidth threshold.

10. The ETIC of claim 9, wherein the target voltage processing circuit further comprises a voltage modifier circuit configured to modify the ET target voltage in each of the plurality of time intervals to generate the modified ET target voltage.

11. The ETIC of claim 10, wherein, in each of the plurality of time intervals, the voltage modifier circuit is further configured to:
    increase the modified ET target voltage at each peak of the ET target voltage; and
    maintain the modified ET target voltage of each peak of the ET target voltage.

12. The ETIC of claim 11, wherein, in each of the plurality of time intervals, the voltage modifier circuit is further configured to decay the modified ET target voltage from a peak level of the modified ET target voltage in an immediately preceding one of the plurality of time intervals.

13. The ETIC of claim 11, wherein the voltage modifier circuit is further configured to decay the modified ET target voltage at a start of each of the plurality of time intervals.

14. The ETIC of claim 12, wherein, in each of the plurality of time intervals, the voltage modifier circuit is further configured to decay the modified ET target voltage until the modified ET target voltage intersects with the ET target voltage.

15. The ETIC of claim 12, wherein, in each of the plurality of time intervals, the voltage modifier circuit is further configured to decay the modified ET target voltage to a predefined minimum level in each of the plurality of time intervals independent of the ET target voltage.

16. A power amplifier apparatus comprising:
an envelope tracking (ET) integrated circuit (ETIC) comprising:
an ET voltage circuit configured to generate an ET voltage based on an ET target voltage for amplifying a radio frequency (RF) signal modulated for transmission in a plurality of time intervals;
a target voltage generation circuit configured to generate the ET target voltage based on a power envelope of the RF signal; and
a target voltage processing circuit configured to:
receive the ET voltage from the target voltage generation circuit;
modify the ET target voltage in each of the plurality of time intervals to generate a modified ET target voltage in response to the RF signal being modulated in a modulation bandwidth higher than or equal to a bandwidth threshold; and
provide the modified ET target voltage to the ET voltage circuit as the ET target voltage to thereby cause the ET voltage circuit to generate the ET voltage based on the modified ET target voltage; and
at least one high-bandwidth power amplifier circuit configured to amplify the RF signal modulated in the modulation bandwidth higher than or equal to the bandwidth threshold.

17. The power amplifier apparatus of claim 16, further comprising a transceiver circuit configured to generate the RF signal in the modulation bandwidth higher than or equal to the bandwidth threshold.

18. The power amplifier apparatus of claim 16, further comprising at least one low-bandwidth power amplifier circuit configured to amplify the RF signal modulated in the modulation bandwidth lower than the bandwidth threshold, wherein the target voltage processing circuit is further configured to pass the ET voltage directly to the ET voltage circuit in response to the modulation bandwidth being lower than the bandwidth threshold.

19. The power amplifier apparatus of claim 18, wherein the transceiver circuit is configured to generate the RF signal in the modulation bandwidth lower than the bandwidth threshold.

20. The power amplifier apparatus of claim 19, wherein the transceiver circuit is further configured to provide a bandwidth indication signal to indicate the modulation bandwidth to the target voltage processing circuit.

21. A wireless device comprising a power amplifier apparatus, the power amplifier apparatus comprises:
an envelope tracking (ET) integrated circuit (ETIC) comprising:
an ET voltage circuit configured to generate an ET voltage based on an ET target voltage for amplifying a radio frequency (RF) signal modulated for transmission in a plurality of time intervals;
a target voltage generation circuit configured to generate the ET target voltage based on a power envelope of the RF signal; and
a target voltage processing circuit configured to:
receive the ET voltage from the target voltage generation circuit;
modify the ET target voltage in each of the plurality of time intervals to generate a modified ET target voltage in response to the RF signal being modulated in a modulation bandwidth higher than or equal to a bandwidth threshold; and
provide the modified ET target voltage to the ET voltage circuit as the ET target voltage to thereby cause the ET voltage circuit to generate the ET voltage based on the modified ET target voltage; and
at least one high-bandwidth power amplifier circuit configured to amplify the RF signal modulated in the modulation bandwidth higher than or equal to the bandwidth threshold.

\* \* \* \* \*